United States Patent [19]
Baker et al.

[11] Patent Number: 5,364,011
[45] Date of Patent: Nov. 15, 1994

[54] MICRO SOLDERING SYSTEM FOR ELECTRONIC COMPONENTS

[75] Inventors: Jay D. Baker, West Bloomfield; Myron Lemecha; Richard K. McMillan, II, both of Dearborn; Kenneth A. Salisbury, Livonia, all of Mich.; Paul E. Stevenson, Colorado Springs, Colo.; Thomas B. Merala, Canton, Mich.; Wells L. Green, Garden City, Mich.; Matti Mikkor, Ann Arbor, Mich.; Bernard A. Meyer, Taylor, Mich.

[73] Assignee: Ford Motor Company, Dearborn, Mich.

[21] Appl. No.: 223,569

[22] Filed: Apr. 6, 1994

Related U.S. Application Data

[63] Continuation of Ser. No. 43,060, Apr. 5, 1993, abandoned.

[51] Int. Cl.⁵ ............................................... B23K 3/00
[52] U.S. Cl. ............................ 228/180.21; 228/33; 228/219; 118/50
[58] Field of Search ............... 228/33, 219, 180.21; 118/50, 302; 427/96, 256

[56] References Cited

U.S. PATENT DOCUMENTS

| | | | |
|---|---|---|---|
| 4,515,297 | 5/1985 | Schoenthaler et al. | 222/160 |
| 4,597,420 | 7/1986 | Schoenthaler et al. | 141/2 |
| 4,622,239 | 11/1986 | Schoenthaler et al. | 427/96 |
| 4,636,406 | 1/1987 | Leicht | 427/96 |
| 4,656,048 | 4/1987 | Kudoh et al. | 427/8 |
| 4,661,368 | 4/1987 | Rohde et al. | 427/8 |
| 4,710,399 | 12/1987 | Dennis | 437/245 |
| 4,743,465 | 5/1988 | Saeki et al. | 427/96 |
| 4,803,124 | 2/1989 | Kunz | 428/200 |
| 4,961,955 | 10/1990 | Goldberg | 427/57 |
| 5,238,176 | 8/1993 | Nishimura | 228/256 |

OTHER PUBLICATIONS

Schulz, "Ejection Soldering", IBM Technical Disclosure Bulletin, vol. 5, No. 1, Jun. 1962, p. 7.

*Primary Examiner*—Kenneth J. Ramsey
*Attorney, Agent, or Firm*—Roger L. May; Mark L. Mollon

[57] ABSTRACT

A micro soldering apparatus and method comprising a system (10) for attaching an electronic component (12) to a substrate (14). The system (10) comprises a soldering tool (16) including a dispensing orifice assembly (18) for pulsatingly dispensing a controlled quantity of molten solder (19) to a component (12) and substrate (14) so that the component is joined to the substrate (14) mechanically and electrically upon solidification of the molten solder (19). There is no physical contact between the dispensing orifice assembly (18) and joint. The system (10) also includes a controller for the soldering tool (16). The controller functions in response to process control parameters so that the controlled quantity of molten solder (19) is dispensed through a non-oxidizing atmosphere by a pressure pulse applied to the molten solder.

20 Claims, 3 Drawing Sheets

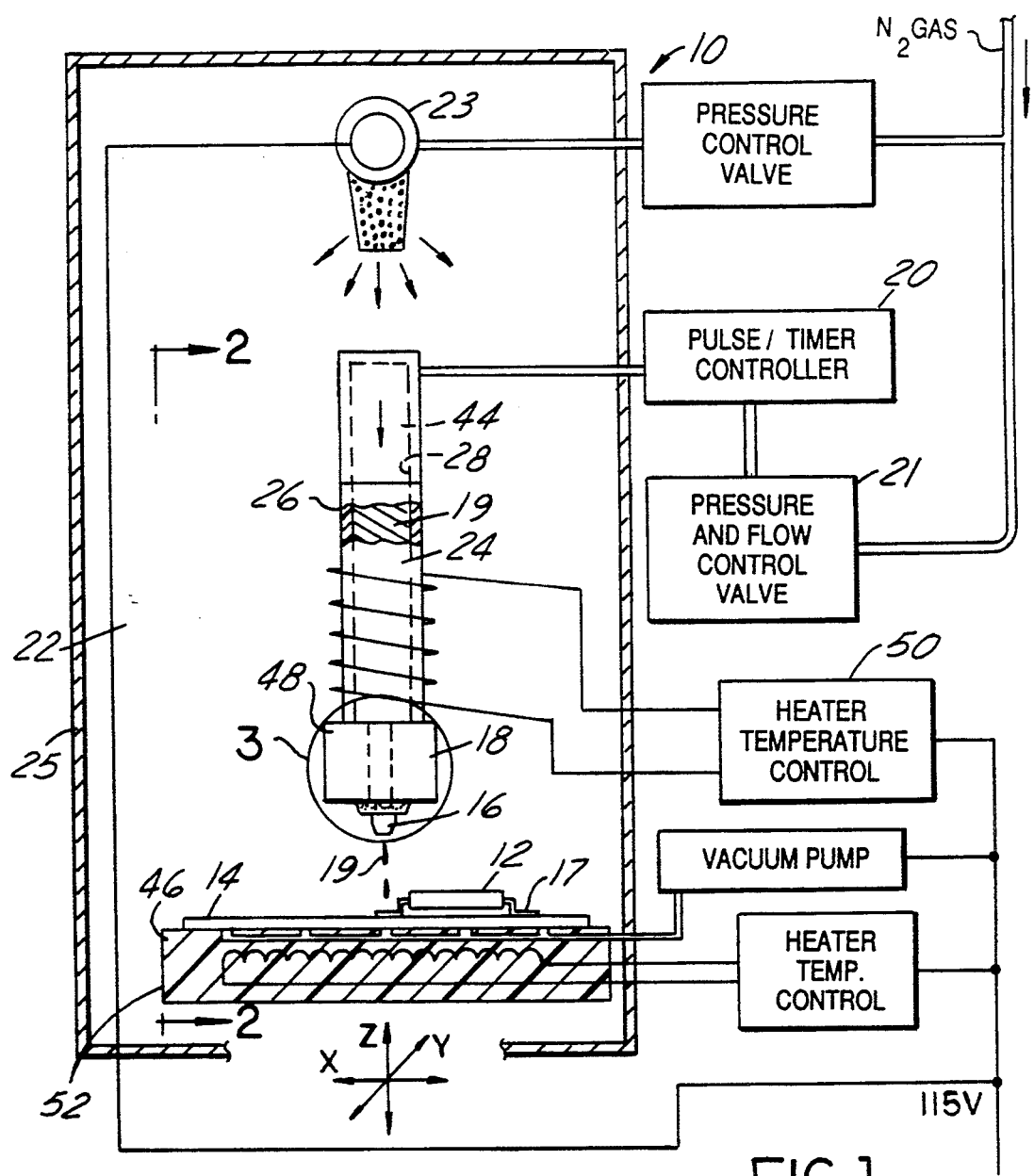
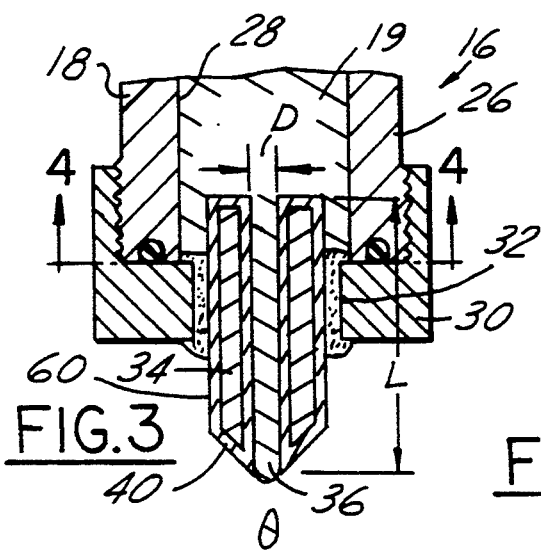
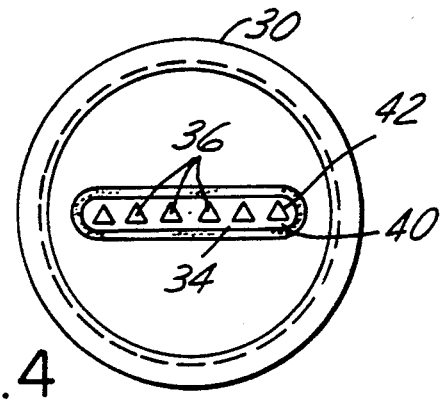
FIG.1
FIG.3
FIG.4

MICRO SOLDERING SYSTEM FOR ELECTRONIC COMPONENTS

CROSS-REFERENCE TO RELATED APPLICATION

This application is a continuation of U.S. Ser. No. 08/043,060, Filed Apr. 5, 1993, and entitled "MICRO SOLDERING SYSTEM FOR ELECTRONIC COMPONENTS", now abandoned.

BACKGROUND OF THE INVENTION

1. Field of the Invention

The present invention generally relates to joining an electronic component to a substrate. More particularly, the invention is concerned with an apparatus and method for dispensing a controlled quantity of molten solder thereto.

2. Related Art Statement

Reliable functioning of an electronic component is dependent upon the correct interplay between its member parts. For their inter-connection, such components still depend in the main upon soldering. In mass production, hundreds of millions of soldered joints are formed daily. Large computers and telephone systems have over $10^5$ soldered joints. Such joints are reliable if they have the correct design and a satisfactory process is available for forming the joints. Ideally, such joints should have a negligible contact resistance and an acceptable strength. Reliability calls for the joints not only to have the desired properties immediately after formation, but about 7 to 13 mm. This allows the component body size to be reduced somewhat. Surface-mounted components are soldered by applying a solder paste to the board through a fine mesh screen or thin metal stencil to control placement of the paste on the board. When a screen is used, selected spaces in the mesh are closed to create a pattern in the open spaces which corresponds to the pattern to be placed on the board. When a stencil is used, the pattern to be placed is etched directly through the metal. Either the screen or stencil is positioned over the board and solder paste is applied through the openings onto the underlying board by a squeegee. After the screen or stencil is removed, the desired pattern of paste is left on the board.

One limitation of the screen print method is that the surface of the board to which the paste is applied must be free of irregularities or projections. Also, the regions surrounding the area to be printed must be large enough to accommodate the frame that supports the screen. Similar disadvantages accrue when using a stencil.

From a thermal point of view, a reliable soldering process must be sufficiently hot to permit wetting, yet not be heated to a temperature at which the board or components to be soldered will be damaged. Ideally, the thermal characteristics should be such that the solder flowing to the area to be soldered does not cool so rapidly that solder flow is impaired before the joint has been effected.

U.S. Pat. No. 4,515,297 discloses methods for multipoint dispensing of viscous material. During a first time interval, pressure is applied to a dispenser to force paste out of dispensing orifices onto an underlying board. The dispensing tool is then moved upwards and away from the surface of the board at a constant velocity. During retrogression, the dispense pressure is constant before termination of the pressure. Thereafter, the dispensing nozzle continues to move away from the board, thus causing separation of the viscous material from the dispensing nozzle openings.

SUMMARY OF THE INVENTION

The present invention provides a micro soldering method and apparatus for attaching an electronic component to a substrate. The micro soldering apparatus includes a soldering tool which has a dispensing orifice assembly through which is dispensed a controlled quantity of a viscous material, such as molten solder, in a pulsed manner. Upon ejection, the molten solder lands at one or more sites on the component or the substrate, or both, so that the component is attached to the substrate mechanically and electrically upon solidification. There is no physical contact between the dispensing orifice assembly and the one or more sites. In operative communication with the soldering tool is means for controlling the soldering tool in response to certain process control parameters so that the controlled quantity of molten solder is dispensed by a pressure pulse through a non-oxidizing atmosphere.

Also disclosed is a method for attaching an electronic component to a substrate. The method comprises the steps of:

providing a soldering tool including a dispensing orifice assembly for dispensing a controlled quantity of molten solder in a pulsed manner;

conveying the substrate and one or more components to be soldered thereto so that the lateral and vertical location thereof is registered in relation to the soldering tool;

purging oxygen from a region surrounding the substrate and dispensing orifice assembly, thereby establishing a non-oxidizing environment therein; and dispensing the controlled quantity of molten solder from one or more dispensing orifice assemblies, the molten solder travelling through the non-oxidizing atmosphere and striking a surface of the component or substrate or both to be joined, the molten solder wetting the surfaces thereof and forming a localized electrical and mechanical contact between the surfaces to be joined.

One object of the present invention is to provide a micro soldering system which produces reliable soldered joints over the life expectancy of the soldered products.

It is also an object of the present invention to provide a micro soldering system in which the solder is brought into contact with both metal surfaces to be joined such that the solder may flow, wet the metal surfaces, and form a solder joint.

Further, it is also an object of the present invention to permit only a small amount of solder in a predetermined volume to be applied at or near the surface where the joint is to be formed.

It is a further object of the present invention to provide a system wherein there are no obstructions to solder flow, such as distorted boards, flux-vapor cushions, and solder oxide skins, thereby allowing any gap to be filled automatically with solder by capillary action.

Furthermore, it is an object of the present invention to deliver the correct amount of solder to the particular joint to be soldered. Ideally, the correct amount of solder is determined such that the amount of solder dispensed is retained automatically in the joints without an excess which would cause an electrical short between adjacent leads.

Another object is to provide a micro soldering system wherein during the solidification period, liquid and solid solder are simultaneously present. As is well known, fluidity strongly decreases as solidification progresses. Consequently, any motion imparted to the soldered joint during solidification is liable to cause cracks in the solder mass that may not be filled. Such behavior would result in an unreliable joint.

Yet another object of the invention is to provide a micro soldering system wherein thermal energy may be delivered locally and avoid the need to subject an entire substrate or component or both to unnecessarily high temperatures.

BRIEF DESCRIPTION OF THE DRAWINGS

FIG. 1 illustrates a micro soldering system as disclosed in the present invention;

FIG. 3 is an enlarged cross-sectional view of an encircled portion of FIG. 1 showing further detail of a dispensing orifice assembly;

FIG. 4 is a cross-sectional view of the dispensing orifice assembly taken along the line 4—4 of FIG. 3;

BEST MODE(S) FOR CARRYING OUT THE INVENTION

Figure 2:
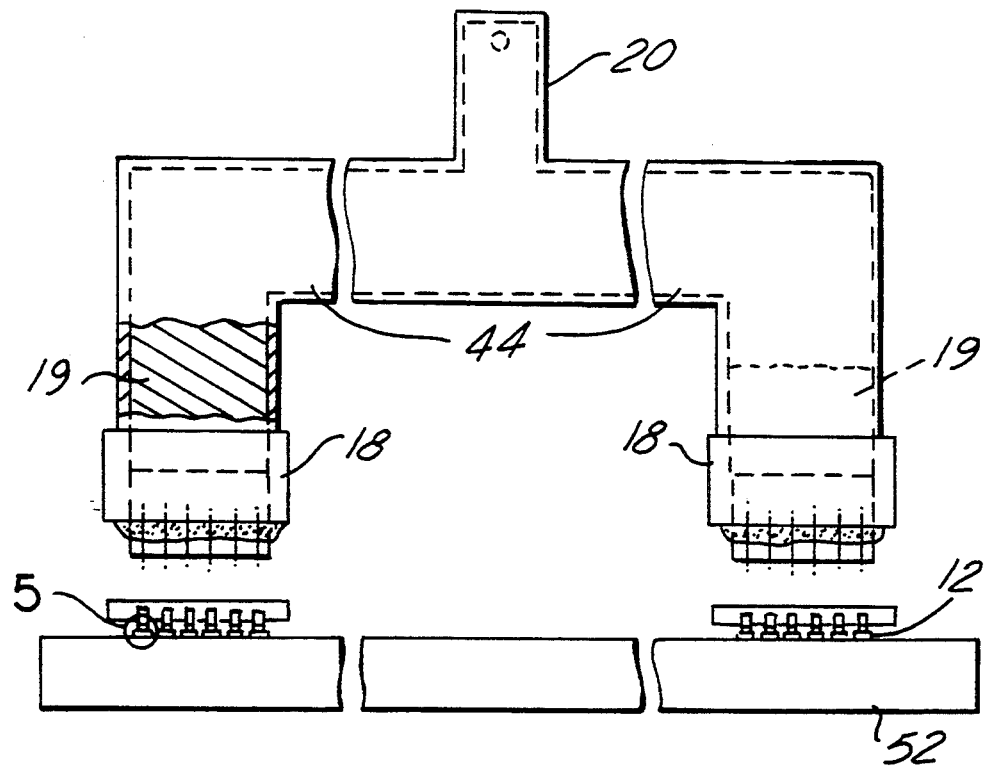
FIG. 2 is a side view from the lines 2—2 of FIG. 1, wherein the micro soldering system is depicted with a plurality of dispensing orifice assemblies.

Referring now to the drawings, and more particularly to FIG. 1, there is shown in schematic form an apparatus 10 for micro soldering. The micro soldering apparatus comprises a system for attaching an electronic component 12 to a substrate 14. As used herein, "substrate" includes printed circuit boards (PCB's), epoxy glass laminates, printed wire boards, and the like. "Substrate" also includes rigid PCB's made from a variety of polymer materials, ceramic substrates (e.g. alumina), semi-rigid and flexible substrates made from various polymer materials (e.g. polyamide), and "molded" polymer PCB's which are usually rigid but are not necessarily flat.

Molten solder 19 is applied by a pulsed delivery to leads 17 which extend from the electronic component 12. This produces an emission of molten solder in a manner analogous to a "spitting" action.

If the component 12 does not have lead, e.g. ceramic chip resistors/capacitors, the micro soldering system 10 may also be employed to solder such components 12 to the surface of the substrate 14. Additionally, the micro soldering system 10 may also be used to solder lead-through-hole components.

Figures 5, 6:
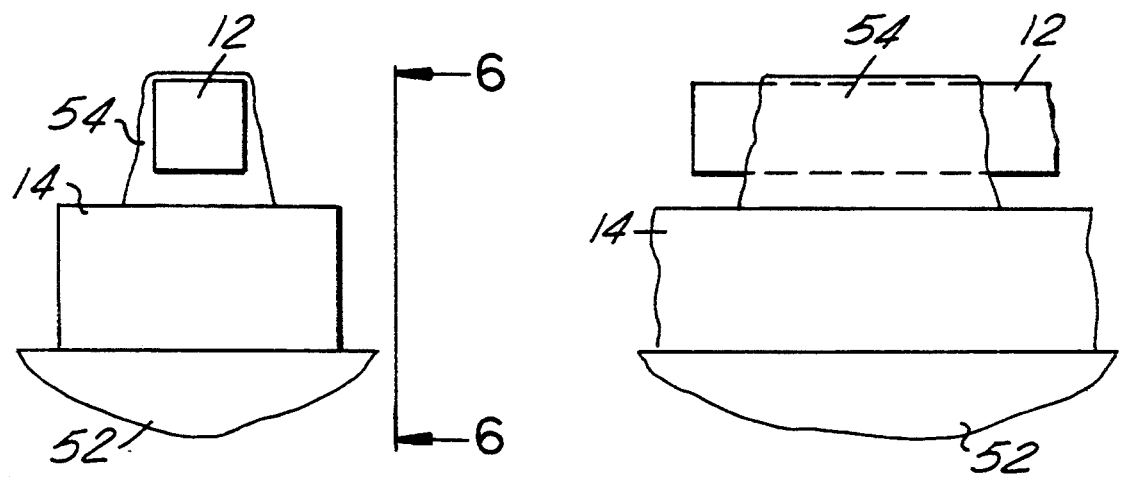
FIG. 5 is an enlarged view of the encircled portion of FIG. 2, illustrating a soldered joint formed between a lead of a component and an underlying substrate.
FIG. 6 is a side elevational view of the soldered joint depicted in FIG. 5.

The micro soldering system 10 includes a soldering tool 16 (FIGS. 1 and 3). The soldering tool 16 includes a dispensing orifice assembly 18 for dispensing a controlled quantity of molten solder 19 at one or more sites on the component 12 or the substrate 14, or both (FIGS. 5 and 6). The molten solder 19 is dispensed so that the component 12 is attached to the substrate 14 mechanically and electrically upon solidification of the molten solder 19 without physical contact between the dispensing orifice assembly 18 and the joint so formed. Optionally, the micro soldering system 10 may be used to apply molten solder to a substrate 14 with no components 12 present, or to a component 12 with no substrate 14 present.

Figure 7:
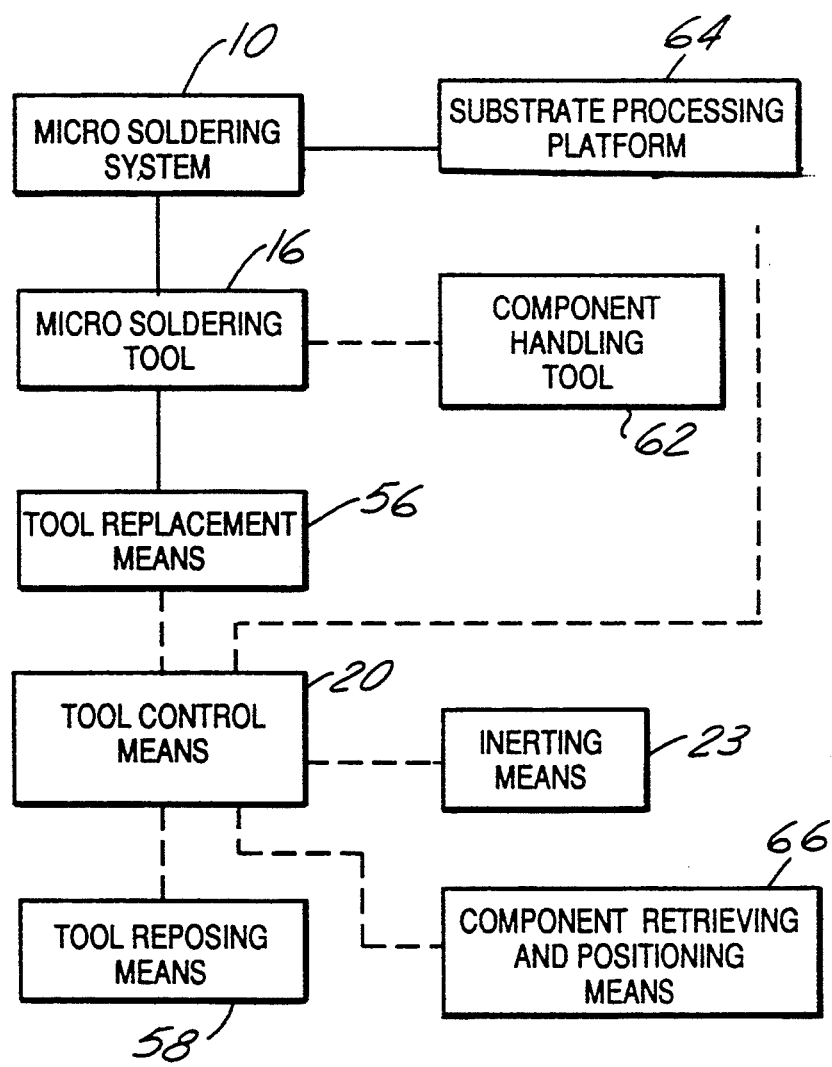
FIG. 7 is a block diagram of various subsystems within the micro soldering system.

As depicted in FIGS. 1 and 7, included in the micro soldering system are means 20 for controlling the soldering tool. Such means include a pulse/timer controller 20. The controller 20 is in operative communication with the soldering tool 16 so that the controlled quantity of molten solder is dispensed by the pressure pulse through a non-oxidizing atmosphere 22 within a vessel 25. For brevity, structural details of the pulse/timer controller are omitted, as they are considered to be within the purview of one of ordinary skill in the art with which this invention is concerned. The controller 20 of the present invention functions in response to such process control parameters as pulse pressure and duration, solder temperature, temperature and oxygen content of the non-oxidizing atmosphere 22, and temperature of the substrate 14.

In FIG. 7, inerting apparatus 23 for providing the non-oxidizing atmosphere 22 is in communication with the pressure and flow control valve 21 (FIG. 1).

Optionally included in the micro soldering system 10 is a means 66 (FIG. 7) for retrieving components 12 and positioning them on the substrate 14 before dispensing the molten solder.

Continuing with reference to FIGS. 1 and 3, the micro soldering system 10 includes a reservoir 24 disposed in fluid communication with the dispensing orifice assembly 18 for delivering molten solder. Preferably, the reservoir 24 is made of titanium or a similar metal which has minimal affinity with solder. The dispensing orifice assembly 18 comprises a hollow barrel member 26 defining an open bore 28 therewithin. A cap 30 engages an end of the barrel member 26, the cap 30 being provided with an aperture 32 which communicates with the bore 28.

A die 34 is sealingly received by a conventional adhesive within the aperture 32. Extending through the die 34 are one or more flow passages 36 through which the molten solder may pass before alighting upon the one or more sites to be soldered.

Preferably, the die 34 comprises silicon, and the one or more flow passages extending therewithin are provided by silicon micro machining procedures.

Each of the one or more flow passages 36 is characterized by a length L and a diameter D. In one die embodiment, the length (L) approximates 10,000 microns, and the diameter (D) approximates 100 microns. An aspect ratio, defined by the relationship of die length to diameter, is about 100:1. The aspect ratio is tailored to the application and depends on the spacing of the flow passages and the desired quantity of molten solder to be dispensed. The length of each flow passage (L) may or may not be changed with the diameter (D) according to a given aspect ratio. For a given flow passage diameter (D), other things being equal, a shorter die may dispense at lower pressures with a shorter pulse time than a die having an aspect ratio of 100:1, but may be less controllable. Where the dimension (L) is longer, other things being equal, higher pressures and longer pulse time are required, but tend to offer more controllability.

Using silicon micro machining technology and sub-micron-sized tools, the dimension D may be of the order of 40 microns. In the preferred embodiment, the edge of the die 34 is about 800 microns wide, and a transverse section of each flow passage defines an equilateral triangle. While a triangular cross-section flow passage has been disclosed, it will be appreciated that other cross-sectional geometries may be possible. These include a square or round flow passage, an elongated (rectangular) slit, and a trapezoidal cross-section.

As illustrated in FIGS. 3 and 4, the die 34 includes a downstream edge 38 which defines a chamfered or tapered portion 40, each flow passage 36 extending through the tapered portion 40. As best shown in FIG. 4, preferably at least one of the flow passages 36 is provided, depending on the application, with the triangular section 42 extending along at least part of its length. Flow passage geometry is also a process parameter which may be selected depending upon the application.

To minimize oxidation of the molten solder in the reservoir 24 before dispensing, an inert atmosphere 44 is provided thereabove. Timed pulsation of the inert atmosphere 44 imparts successive impulses to the molten solder in the barrel 26. To diffuse pulsed pressure above the molten solder, the reservoir 24 is provided with a perforated plate located above the free surface of molten solder. The plate tends to distribute pressure pulses across the surface of the molten solder and thus makes more consistent the quantity of molten solder dispensed from each flow passage 36. Because the solder is incompressible, the pulsed forces generated by the control means 20 are transmitted through the body of molten solder housed within the reservoir 24. The result is to eject minuscule globules of molten solder 19 through the one or more flow passages 36. When the pulsed pressure is released, capillary action and surface tension combine to retain a volume of molten solder within the flow passages 36. The non-oxidizing atmosphere 22 which surrounds the dispensing orifice assembly 18 prohibits the meniscus of molten solder from oxidizing at the exits from the flow passages.

While pulsed gas pressure has been disclosed herein, in an alternate embodiment of the present invention, the pressure pulse is generated by a diaphragm-type positive displacement pump as the motive force for dispensing molten solder. In this design, the pump is in fluid communication with the reservoir (above) and with the dispensing orifice assembly 18 (below). The pump's diaphragm is in operative communication with and applies a motive force to the molten solder. In this approach, the free surface of molten solder in the reservoir 24 is still blanketed by a non-oxidizing atmosphere.

Continuing with reference to FIG. 1, the micro soldering system 10 preferably includes relative positioning means 46. Such means 46 may position the substrate so that it may be moved in relation to the dispensing orifice assembly 18, or vice-versa.

Also illustrated in FIG. 1 is means 50 for delivering thermal energy to the reservoir 24 of molten solder and controlling the delivery of such thermal energy. Conventionally, such means include a standard industrial "sleeve-type" heater with a temperature controller in electrical communication with a sheath of standard industrial heater wire. Such heaters may be purchased from Hi-Watt, Inc. of Warren, Mich. The means 50 maintains solder in a molten state at a desired temperature throughout the micro soldering system 10. Included in the thermal energy delivery means 50 is a means for sensing solder temperature in the reservoir 24, barrel 26, and dispensing orifice assembly 18. Such a device is available from Industrial Temperature Control, Inc. of Dearborn, Mich.

In the preferred embodiment, depending on the component 12, each dispensing orifice assembly 18 is provided with a number of flow passages depending on the configuration of component(s) 12 to be soldered. One embodiment includes 64 flow passages 36. As illustrated in FIG. 2, the micro soldering system 10 may be provided with a plurality of dispensing orifice assemblies 18. The embodiment shown illustrates the front two of four such assemblies. More than four dispensing orifice assemblies 18 may be required for simultaneous soldering of multiple components 12.

FIG. 7 presents by way of overview a block diagram illustrating the main components of the micro soldering system 10. As described above, the micro soldering system 10 includes the micro soldering tool 16 which is optionally in operative communication with a component handling tool 62. An alternative embodiment of the micro soldering system 10 includes a tool replacement means 56, together with the tool control means 20 described earlier. Also as an optional feature is a tool reposing means 58 which has the capability to position the soldering tool 18 at a parking station (not shown) in readiness for deployment. The parking station provides a non-oxidizing atmosphere and temperatures sufficient to sustain the solder in a fluid state. The parking station sustains the inerting atmosphere at the dispensing orifice assembly 18 and in the reservoir 24.

Returning to FIG. 3, the preferred embodiment of the invention calls for a cladding layer 60 which encapsulates those portions of the die 34 which would otherwise be in contact with molten solder. Preferably, the cladding layer 60 penetrates and extends along the flow passages 36. In this manner, the cladding layer 60 chemically isolates the molten solder from the die 34, thereby avoiding flow passage degradation due to leaching of silicon caused by silicon-solder reaction and clogging by reaction products of molten solder with the silicon of which the die 34 is formed. Additionally, the cladding layer prevents contamination of solder by such reaction products. Preferably, the cladding layer 60 comprises silicon nitride, boron nitride, or the like and is about 1,000 Angstroms in thickness. The use of boron nitride serves to eliminate any contact between silicon and solder.

In light of the foregoing description of the apparatus which comprises the disclosed micro soldering system 10, it will be apparent that the present invention includes a method for attaching an electronic component 12 to a substrate 14 or for soldering multiple components simultaneously. The method calls for the provision of a soldering tool 16 which includes a dispensing orifice assembly 18 for dispensing a controlled quantity of molten solder in a pulsed manner to join the component 12 to the substrate 14 mechanically and electrically upon solidification. During this step, there is no physical contact between the dispensing orifice assembly 18 and the one or more sites.

The disclosed method also includes the step of conveying the substrate 14 and one or more components 12 to be soldered thereto so that the lateral (X,Y) and vertical (Z) location thereof is registered in relation to the soldering tool 16. Preferably, the die 34 lies (e.g. along the Y-axis) perpendicular to the length of the lead to be soldered (e.g. along the X-axis) and the flow path (e.g. along the Z-axis) lies perpendicular to the substrate (e.g. in the X-Y plane). Such registration along three axes is especially useful in cases where the substrate 14 is not flat, e.g. molded PCB's.

Another step is that of purging oxygen from a region surrounding the substrate 14 and the dispensing orifice assembly 18, thereby establishing a non-oxidizing environment therein. This step is performed by the inerting means 23 and pressure control valve 21.

The controlled quantity of molten solder is dispensed by pulsation from one or more dispensing orifice assemblies. Upon ejection, the molten solder 19 travels through the non-oxidizing atmosphere and strikes a surface of the component 12 or substrate 14, or both, to be joined. The molten solder wets the surfaces thereof and forms a localized electrical and mechanical contact between the surfaces to be joined.

If desired, the method also includes the step of preheating the substrate 14 during prior processing, or during the purging step. Alternatively, the substrate 14 may also be heated during the solder dispensing step.

The step of heating the substrate may occur at a substrate processing platform 64 (FIGS. 1 and 7). The substrate processing platform 64 includes a modified version of a machine manufactured by Universal Instruments, Inc. (Model 4682 B TAB bonding machine). The substrate processing platform 64 includes a platform control subsystem (not shown) which provides programmable control of the substrate processing platform and communications interfaces among platform elements and between the substrate processing platform and the micro soldering system 10. A positioning subsystem provides programmable control of the relative position of the substrate 14 with respect to the soldering tool 16. The positioning subsystem may control motion along four axes (X,Y,Z and one rotational axis). In some embodiments, more or fewer axes of motion are employed.

Other components of the substrate processing platform include a tool positioning head, a substrate handling mechanism, a substrate registration subsystem, a component feeding subsystem, a component handling tool, a component registration subsystem, a component handling tool change subsystem, and additional subsystems.

As the substrate 14 is conveyed into the micro soldering system 10, fixtured in the work area, and registered, flux and/or adhesive is applied to the substrate, if required and if not completed in prior processing. When used, an adhesive is applied to the substrate 14, before emplacement of the component 12, at a location beneath the component body, and away from lead/pad areas. When used, flux is applied to component lead and/or pad areas.

If necessary, component handling and micro soldering tools corresponding to the component to be micro soldered are obtained from the appropriate tool control means 20, including a tool change system. The component to be micro soldered is obtained from the component feeding system and registered.

The relative positions of substrate 14, component 12, and micro soldering tool 16 are adjusted to achieve the desired distance between the dispensing orifice assembly 18 and the substrate 14. During this period, the micro soldering system 10 purges oxygen from the region surrounding the component attachment location and establishes a non-oxidizing atmosphere. Preheating of the substrate may occur during the purge phase and continue during the micro soldering operation. The non-oxidizing atmosphere between the dispensing orifice assembly 18 and the substrate 14 may also serve as a substrate heating mechanism if desired. Alternatively, the thermal energy delivery means 50 may take the form of infrared lamps for delivering heat to the top or bottom of the substrate 14. Also, preheating can be accomplished during prior processing.

After solder is dispensed in globlet form as a pulsed ejection, the component handling tool 62 retracts. If required, the above steps are repeated for additional components 12. Next, the substrate 14 is released from fixturing and conveyed out of the system. If desired, an additional reflow step may ensue in subsequent processing to establish optimum solder filet geometry for micro soldered components.

Dispensing is carried out by ejecting molten solder through flow passages 36 which are etched into the silicon die 34. A single cycle of the dispensing step begins with the opening of a solenoid valve in a conduit connecting the reservoir 24 to an inerting means 23 for delivering a source of inert gas such as nitrogen at a controlled pressure (typically between 80–160 kilo-pascals). The barrel pressure rises as the chamber fills with nitrogen. When the pressure force is sufficient to overcome the resistive surface tension forces of the solder in the flow passages, dispensing occurs. Drops of molten solder are ejected directly onto the appropriate metalized surfaces to be joined. Freezing occurs on contact. The pulse duration is about 70 milliseconds, after which the solenoid valve is closed and the system vented.

It will be apparent that the pressure at the point of emergence from a flow passage equals the applied gas pressure ($P_A$) plus the solder head pressure ($P_S$). The solder head pressure in turn equals the pressure due to the column of molten solder in the reservoir plus the pressure due to the solder column within the die 34. These values are a function of solder density, gravitational acceleration, die width, die length, die thickness, the length (L), and the number of flow passages, the cross-sectional area of each flow passage, the cross-sectional area of the molten solder column, and the total mass of solder.

There is no flow of molten solder below a threshold pressure. Above that pressure, there are three main modes of flow: dropwise, stream, and atomization. Of these modes, the dropwise mode of flow (one drop at a time) is preferred. In a free body diagram for a droplet, below the threshold pressure surface tension forces balance the weight of the droplet and the pressure force is exerted thereupon. When the external forces exceed the maximum surface tension, a drop falls, and flow is initiated unless such forces are quickly alleviated.

Due to oxide formation and the increase of solder surface tension in the presence of dissolved oxygen, the drop formation process is particularly sensitive to oxygen concentration in the vicinity of the nozzles. Hence, a device is provided to purge the process area with hot nitrogen or other non-oxidizing gas(es). Preferably, the device consists of two inerting streams, one being dispensed centrally downward into the process area along the axis of the dispensing orifice assembly 18 and one directed radially inwardly into the process area.

Preferably, the die 34 is at a height of about 6 mm from the substrate 14. The process area lies directly below the die 34 and between it and the substrate 14. Hot nitrogen enters this domain from both the central and radial inlets through an insulated inlet manifold at about 250° C. with an initial velocity of 0.133 m/s and an oxygen concentration of about 7 ppm. The ambient temperature and oxygen concentration are about 40° C. or higher and 20% (200,000 ppm) respectively. After thermal equilibrium is established, the substrate 14 is also at about 40° or higher.

The velocities in the process region are low enough to avoid blowing the drops 19 of molten solder off course as they are dispensed.

In one experimental run, pulse pressure was monitored, together with pulse duration. The molten solder was heated to 250° C., the inerting atmosphere was heated to 250° C., and the pallet temperature was set to 190° C. Before testing, a two-second pulse at about 200 kilo-pascals was imparted to flush the silicon die to remove any debris which may have entered into the flow passages through handling of the dispensing orifice assembly 18.

After flushing, the silicon die 34 was brushed with a soft solder wiping brush to remove any solder left on the die during the flushing process. The die 34 was also wiped between experimental runs.

Pulse pressure was varied from about 55 kilo-pascals to about 210 kilo-pascals in about 70–100 kilo-pascal increments, and the pulse pressure duration was varied from 30–100 milliseconds. The best results were obtained with an 124 kilo-pascals dispense pulse and a 40 millisecond pulse duration.

By using the disclosed silicon single crystal die 34, the micro soldering system 10 can produce reliable joints in integrated circuits wherein the lead pitch (i.e. center-to-center distance between adjacent component leads) is 0.2 mm or below, which represents a significantly closer spacing then is feasible using conventional techniques.

We claim:

1. An micro soldering system for attaching an electronic component to a substrate, comprising:
   a soldering tool including a dispensing orifice assembly for dispensing a controlled quantity of molten solder at one or more sites on the component or the substrate or both so that the component is attached to the substrate mechanically and electrically upon solidification of the molten solder without physical contact between the dispensing orifice assembly and the one or more sites; and
   means for controlling the soldering tool in response to process control parameters so that the controlled quantity of molten solder is dispensed by a pressure pulse through a non-oxidizing atmosphere.

2. The micro soldering system of claim 1, further including:
   a reservoir disposed in fluid communication with the dispensing orifice assembly for delivering molten solder thereto; the dispensing orifice assembly comprising:
   a hollow barrel member in communication with the reservoir, the barrel member defining an open bore therewithin;
   a cap which engages an end of the barrel member, the cap being provided with an aperture which communicates with the bore;
   a die sealingly received within the aperture, the die having one or more flow passages through which the molten solder may pass before alighting upon one or more sites to be soldered.

3. The micro soldering system of claim 2 wherein the die comprises silicon, the die, and the one or more flow passages being prepared by silicon micro machining procedures.

4. The micro soldering system of claim 3, wherein the die and the flow passages are provided with a cladding layer so that the molten solder is chemically isolated from the die, thereby avoiding flow obstruction by reaction products of molten solder with the die and solder contamination.

5. The micro soldering system of claim 4, wherein the cladding layer comprises a member selected from the group consisting of silicon nitride, boron nitride, and the like.

6. The micro soldering system of claim 2 wherein the die includes a downstream edge defining a chamfered portion, each flow passage extending through the chamfered portion.

7. The micro soldering system of claim 2, wherein at least one of the flow passages is provided with a triangular section along at least part of its length.

8. The micro soldering system of claim 2, wherein one or more of the flow passages is characterized by an aspect ratio defined by the relationship of its length (L) to its average diameter (D), the aspect ratio being about 100:1.

9. The micro soldering system of claim 2, wherein each dispensing orifice assembly is provided with 64 flow passages.

10. The micro soldering system of claim 2, wherein there is a single component, and the soldering tool is provided with a number of dispensing orifice assemblies selected from the group consisting of 1, 2, 3, and 4.

11. The micro soldering system of claim 1, further including:
    means for replacing the soldering tool.

12. The micro soldering system of claim 1, further including:
    means for reposing the soldering tool at a parking station in readiness for deployment, the parking station providing a non-oxidizing atmosphere and temperature sufficient to sustain the solder in a fluid state.

13. The micro soldering system of claim 1, further including inerting means for providing an inert atmosphere above the reservoir to minimize oxidation of the molten solder before dispensing.

14. The micro soldering system of claim 1, further including means for altering the relative positioning between the substrate and the dispensing orifice assembly.

15. The micro soldering system of claim 1, wherein the means for controlling the soldering tool includes means for altering the relative positioning between the dispensing orifice assembly and the substrate.

16. The micro soldering system of claim 1, wherein the soldering tool includes means for delivering thermal energy to the reservoir of molten solder.

17. The micro soldering system of claim 1, further comprising:
    means for retrieving components and positioning them on a substrate.

18. A method for attaching an electronic component to a substrate, comprising the steps of:
    providing a soldering tool including a dispensing orifice assembly for dispensing a controlled quantity of molten solder in a pulsed manner at one or more sites on the component or the substrate or both so that the component is attached to the substrate mechanically and electrically upon solidification of the molten solder without physical contact between the dispensing orifice assembly and the one or more sites; conveying the substrate and one or more components to be soldered thereto so that the lateral and vertical location thereof is registered in relation to the soldering tool;

purging oxygen from a region surrounding the substrate and dispensing orifice assembly, thereby establishing a non-oxidizing environment therein;

dispensing the controlled quantity of molten solder from one or more dispensing orifice assemblies, the molten solder travelling through the non-oxidizing atmosphere and striking a surface of the component or substrate or both to be joined, the molten solder wetting the surfaces thereof and forming a localized electrical and mechanical contact between the surfaces to be joined.

19. The method of claim 18, further comprising the step of:

preheating the substrate during the purging step.

20. The method of claim 19, further comprising the step of:

heating the substrate during the solder dispensing step.

* * * * *